(12) United States Patent
Doddaiah et al.

(10) Patent No.: US 12,316,353 B2
(45) Date of Patent: May 27, 2025

(54) DYNAMIC SELECTION BETWEEN COMPRESSION ALGORITHMS TO ACHIEVE A TARGET DATA REDUCTION RATIO

(71) Applicant: Dell Products, L.P., Hopkinton, MA (US)

(72) Inventors: Ramesh Doddaiah, Westborough, MA (US); Owen Martin, Hopedale, MA (US)

(73) Assignee: Dell Products, L.P., Hopkinton, MA (US)

( * ) Notice: Subject to any disclaimer, the term of this patent is extended or adjusted under 35 U.S.C. 154(b) by 198 days.

(21) Appl. No.: 18/230,794

(22) Filed: Aug. 7, 2023

(65) Prior Publication Data

US 2025/0055479 A1 Feb. 13, 2025

(51) Int. Cl.
*H03M 7/00* (2006.01)
*H03M 7/30* (2006.01)

(52) U.S. Cl.
CPC ....... *H03M 7/6082* (2013.01); *H03M 7/3062* (2013.01)

(58) Field of Classification Search
CPC .......................... H03M 7/6082; H03M 7/3062
USPC ..................................................... 341/50, 51
See application file for complete search history.

(56) References Cited

U.S. PATENT DOCUMENTS

| | | | |
|---|---|---|---|
| 10,509,676 B1 * | 12/2019 | Bassov | ................... G06F 3/064 |
| 10,664,165 B1 * | 5/2020 | Faibish | ................. G06F 3/0638 |
| 2014/0244604 A1 * | 8/2014 | Oltean | ................ H03M 7/3091 |
| | | | 707/693 |
| 2023/0409223 A1 * | 12/2023 | Jiang | ..................... G06F 3/0604 |

* cited by examiner

*Primary Examiner* — Jean B Jeanglaude
(74) *Attorney, Agent, or Firm* — Anderson Gorecki LLP

(57) ABSTRACT

A method and apparatus for enabling dynamic selection between compression algorithms to achieve a target data reduction ratio is provided to predict, on a per-extent basis, whether a write operation targeting a piece of data on a particular extent would be preferentially compressed using either compression algorithm A or compression algorithm B. By selectively implementing compression of particular write operations using compression algorithm B, when it is predicted to achieve a greater compression benefits, it is possible to reduce the overall data reduction ratio achieved by the compression engine while economizing the amount of resources expended by the compression engine. The dynamic selection process determines a per-extent compressibility ratio, which is used in connection with a first threshold to evaluate write operations on a per-extent basis. The dynamic selection processes also determines a per-extent size threshold to select between compression algorithms for particular write operations.

18 Claims, 11 Drawing Sheets

- Compression Algorithm A: Faster, and uses fewer hardware resources to implement, but generally results in lower Data Reduction Ratio (DRR)

- Compression Algorithm B: Slower, and uses more hardware resources to implement, but generally results in higher Data Reduction Ratio (DRR)

Extent B vs. A Compressibility Ratios

- Region A: High extent activity – bypass compression
- Region B: High DRR – Always use Algorithm B
- Region C: Select between Algorithm A and Algorithm B based on dynamically adjustable value of threshold T
- Region D: Low DRR – Always use Algorithm A
- Region E: Low extent activity – Always use Algorithm B

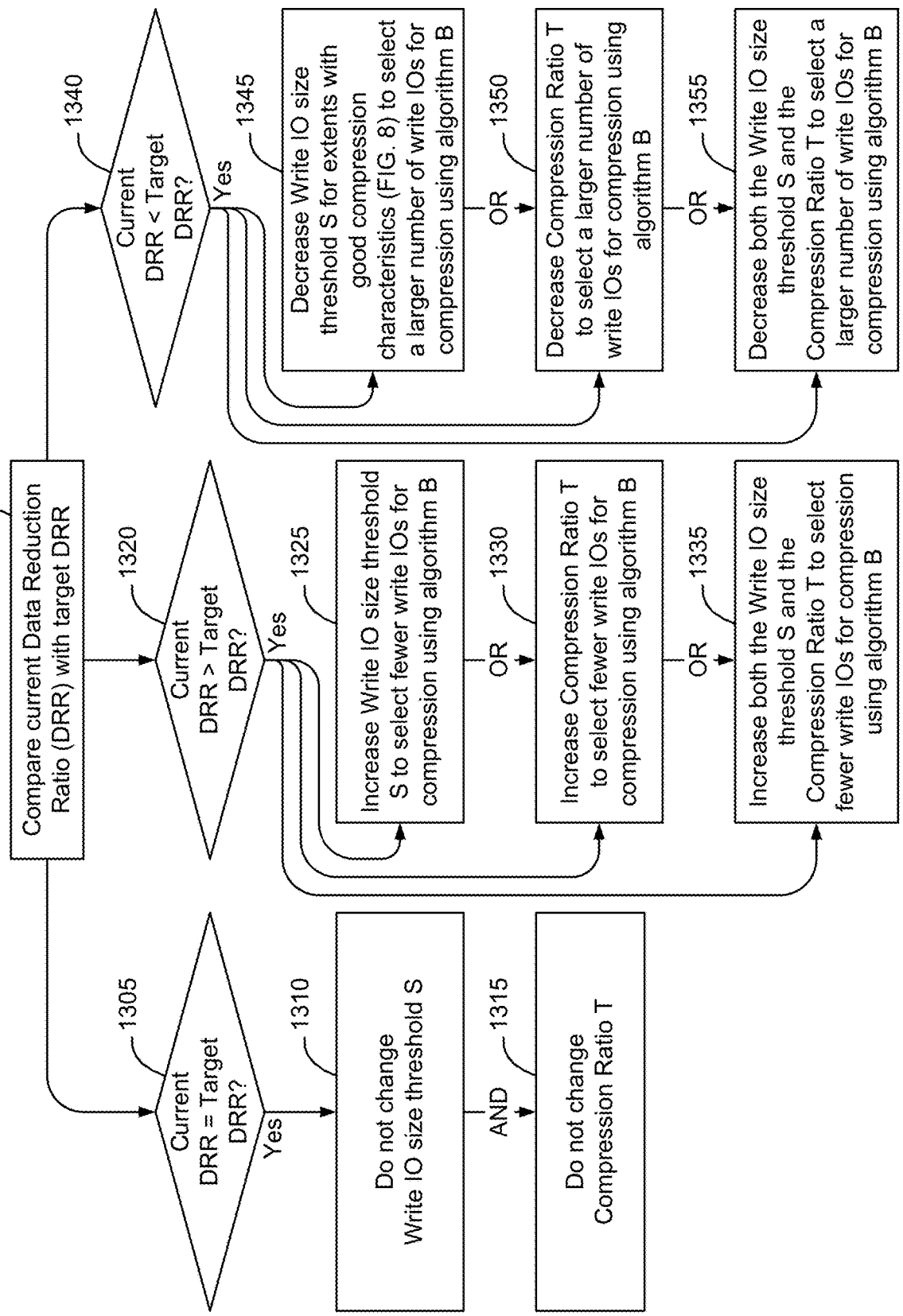

DYNAMIC SELECTION BETWEEN COMPRESSION ALGORITHMS TO ACHIEVE A TARGET DATA REDUCTION RATIO

FIELD

This disclosure relates to computing systems and related devices and methods, and, more particularly, to a method and apparatus for enabling dynamic selection between compression algorithms to achieve a target data reduction ratio.

SUMMARY

The following Summary and the Abstract set forth at the end of this document are provided herein to introduce some concepts discussed in the Detailed Description below. The Summary and Abstract sections are not comprehensive and are not intended to delineate the scope of protectable subject matter, which is set forth by the claims presented below.

All examples and features mentioned below can be combined in any technically possible way.

In some embodiments, a method and apparatus for enabling dynamic selection between compression algorithms to achieve a target data reduction ratio is provided. By providing a compression engine configured to select between multiple compression algorithms, it is possible to achieve a target data reduction ratio while minimizing consumption of the hardware resources of the compression engine, by focusing the use of a more efficient but computationally expensive compression algorithm on write IO operations that are predicted to provide maximal benefit to the overall data reduction ratio achieved by the compression engine. According to some embodiments, a method is provided to predict, on a per-extent basis, whether a write operation targeting a piece of data on a particular extent would be preferentially compressed using either compression algorithm A or compression algorithm B. By selectively implementing compression of particular write operations using compression algorithm B, when it is predicted to achieve a greater compression benefits, it is possible to reduce the overall data reduction ratio achieved by the compression engine while economizing the amount of resources expended by the compression engine.

In some embodiments, a method of dynamic selection between compression algorithms to achieve a target data reduction ratio, includes computing a per-extent compressibility ratio for each extent of data stored on a storage system, the per-extent compressibility ratio comparing a first compressibility of segments of data of the respective extent when compressed using compression algorithm A and a second compressibility of segments of data of the respective extent when compressed using compression algorithm B. The method also includes receiving write operations, each write operation being directed to a respective portion of a segment of a respective extent and, for each write operation, determining whether data of the write operations should be compressed. In response to determining that the data of the write operation should not be compressed, the method includes storing the data of the write operation in uncompressed form in storage. In response to determining that the data of the write operation should be compressed, the method includes determining a respective compressibility ratio for the respective extent, and comparing the compressibility ratio for the respective extent with a dynamically adjustable extent compressibility ratio threshold value. In response to a determination that the compressibility ratio for the respective extent indicates that the extent exhibits greater compressibility using compression algorithm B than using compression algorithm A, the method includes comparing a size of the respective write operation to a dynamically adjustable write IO size threshold value. In response to a determination that the size of the respective write operation is larger than the dynamically adjustable write IO size threshold value, the method includes compressing data of the respective write operation using compression algorithm B. In response to a determination that the compressibility ratio for the respective extent indicates that the extent does not exhibit greater compressibility using compression algorithm B than using compression algorithm A, or in response to a determination that the size of the respective write operation is smaller than the dynamically adjustable write IO size threshold value, the method includes compressing data of the respective write operation using compression algorithm A.

In some embodiments, compression algorithm A is faster and less computationally intensive than compression algorithm B, and compression algorithm A on average results in a lower data reduction ratio than compression algorithm B.

In some embodiments, compression algorithm A is more computationally efficient at compressing smaller sized write operations than compression algorithm B, and compression algorithm B is more computationally efficient at compressing larger sized write operations than compression algorithm A.

In some embodiments, computing a per-extent compressibility ratio for each extent of data includes maintaining a per-extent compressibility histogram for each extent, the per-extent compressibility histogram containing a plurality of compression size buckets for each compression algorithm, and populating the buckets of the per-extent compressibility histogram in connection with compressing data of write operations on segments of data of the respective extent.

In some embodiments, in response to a determination that the compressibility ratio for the respective extent indicates that the extent exhibits greater compressibility using compression algorithm B than using compression algorithm A, the method further includes sampling the write operation to select a percentage of the write operations to be compressed using compression algorithm A prior to comparing the size of the respective write operation to the dynamically adjustable write IO size threshold value.

In some embodiments, in response to a determination that the size of the respective write operation is larger than the dynamically adjustable write IO size threshold value, the method further includes sampling the write operation to select a percentage of the write operations to be compressed using compression algorithm A instead of compressing data of the respective write operation using compression algorithm B.

In some embodiments, the method further includes receiving a target data reduction ratio, determining a currently achieved data reduction ratio, and comparing the currently achieved data reduction ratio with the target data reduction ratio. In response to a determination that the currently achieved data reduction ratio does not match the target data reduction ratio, the method further includes adjusting the dynamically adjustable extent compressibility ratio threshold value, or adjusting the dynamically adjustable write IO size threshold value, or adjusting both the dynamically adjustable extent compressibility ratio threshold value and the dynamically adjustable write IO size threshold value.

In some embodiments, the method further includes receiving a target data reduction ratio, determining a currently achieved data reduction ratio, and comparing the currently achieved data reduction ratio with the target data reduction ratio. In response to a determination that the currently achieved data reduction ratio is higher than the target data reduction ratio, the method further includes changing the dynamically adjustable extent compressibility ratio threshold value to select a smaller percentage of write operations for compression using compression algorithm B, or changing the dynamically adjustable write IO size threshold value to select a smaller percentage of write operations for compression using compression algorithm B, or changing both the dynamically adjustable extent compressibility ratio threshold value and the dynamically adjustable write IO size threshold value to select a smaller percentage of write operations for compression using compression algorithm B.

In some embodiments, the method further includes receiving a target data reduction ratio, determining a currently achieved data reduction ratio, and comparing the currently achieved data reduction ratio with the target data reduction ratio. In response to a determination that the currently achieved data reduction ratio is lower than the target data reduction ratio, the method further includes changing the dynamically adjustable extent compressibility ratio threshold value to select a larger percentage of write operations for compression using compression algorithm B, or changing the dynamically adjustable write IO size threshold value to select a larger percentage of write operations for compression using compression algorithm B, or changing both the dynamically adjustable extent compressibility ratio threshold value and the dynamically adjustable write IO size threshold value to select a larger percentage of write operations for compression using compression algorithm B.

In some embodiments, a compression engine, includes first compression hardware configured to implement data compression operations using compression algorithm A, and second compression hardware configured to implement data compression operations using compression algorithm B. The compression engine also includes one or more processors and one or more storage devices storing instructions that are operable, when executed by the one or more processors, to cause the one or more processors to perform operations including computing a per-extent compressibility ratio for each extent of data stored on a storage system, the per-extent compressibility ratio comparing a first compressibility of segments of data of the respective extent when compressed using compression algorithm A and a second compressibility of segments of data of the respective extent when compressed using compression algorithm B, and receiving write operations, each write operation being directed to a respective portion of a segment of a respective extent. The operations further include, for each write operation, determining a respective compressibility ratio for the respective extent, and comparing the compressibility ratio for the respective extent with a dynamically adjustable extent compressibility ratio threshold value. In response to a determination that the compressibility ratio for the respective extent indicates that the extent exhibits greater compressibility using compression algorithm B than using compression algorithm A, the operations further include comparing a size of the respective write operation to a dynamically adjustable write IO size threshold value. In response to a determination that the size of the respective write operation is larger than the dynamically adjustable write IO size threshold value, the operations further include compressing data of the respective write operation using the second compression hardware configured to implement data compression operations using the compression algorithm B. In response to a determination that the compressibility ratio for the respective extent indicates that the extent does not exhibit greater compressibility using compression algorithm B than using compression algorithm A, or in response to a determination that the size of the respective write operation is smaller than the dynamically adjustable write IO size threshold value, the operations further include compressing data of the respective write operation using the first compression hardware configured to implement data compression operations using the compression algorithm A.

In some embodiments, compression algorithm A is faster and less computationally intensive than compression algorithm B, and compression algorithm A on average results in a lower data reduction ratio than compression algorithm B.

In some embodiments, compression algorithm A is more computationally efficient at compressing smaller sized write operations than compression algorithm B, and compression algorithm B is more computationally efficient at compressing larger sized write operations than compression algorithm A.

In some embodiments, computing a per-extent compressibility ratio for each extent of data includes maintaining a per-extent compressibility histogram for each extent, the per-extent compressibility histogram containing a plurality of compression size buckets for each compression algorithm, and populating the buckets of the per-extent compressibility histogram in connection with compressing data of write operations on segments of data of the respective extent.

In some embodiments, in response to a determination that the compressibility ratio for the respective extent indicates that the extent exhibits greater compressibility using compression algorithm B than using compression algorithm A, the operations performed by the one or more processors further include sampling the write operation to select a percentage of the write operations to be compressed using the first compression hardware configured to implement compression algorithm A prior to comparing the size of the respective write operation to the dynamically adjustable write IO size threshold value.

In some embodiments, in response to a determination that the size of the respective write operation is larger than the dynamically adjustable write IO size threshold value, the operations performed by the one or more processors further include sampling the write operation to select a percentage of the write operations to be compressed using the first compression hardware configured to implement compression algorithm A instead of compressing data of the respective write operation using the second compression hardware configured to implement compression algorithm B.

In some embodiments, the operations performed by the one or more processors further include receiving a target data reduction ratio, determining a currently achieved data reduction ratio, and comparing the currently achieved data reduction ratio with the target data reduction ratio. In response to a determination that the currently achieved data reduction ratio does not match the target data reduction ratio, the operations further include adjusting the dynamically adjustable extent compressibility ratio threshold value, or adjusting the dynamically adjustable write IO size threshold value, or adjusting both the dynamically adjustable extent compressibility ratio threshold value and the dynamically adjustable write IO size threshold value.

In some embodiments, the operations performed by the one or more processors further include receiving a target data reduction ratio, determining a currently achieved data reduction ratio, and comparing the currently achieved data reduction ratio with the target data reduction ratio. In response to a determination that the currently achieved data reduction ratio is higher than the target data reduction ratio, the operations further include changing the dynamically adjustable extent compressibility ratio threshold value to select a smaller percentage of write operations for compression using compression algorithm B, or changing the dynamically adjustable write IO size threshold value to select a smaller percentage of write operations for compression using compression algorithm B, or changing both the dynamically adjustable extent compressibility ratio threshold value and the dynamically adjustable write IO size threshold value to select a smaller percentage of write operations for compression using compression algorithm B.

In some embodiments, the operations performed by the one or more processors further include receiving a target data reduction ratio, determining a currently achieved data reduction ratio, and comparing the currently achieved data reduction ratio with the target data reduction ratio. In response to a determination that the currently achieved data reduction ratio is lower than the target data reduction ratio, the operations further include changing the dynamically adjustable extent compressibility ratio threshold value to select a larger percentage of write operations for compression using compression algorithm B, or changing the dynamically adjustable write IO size threshold value to select a larger percentage of write operations for compression using compression algorithm B, or changing both the dynamically adjustable extent compressibility ratio threshold value and the dynamically adjustable write IO size threshold value to select a larger percentage of write operations for compression using compression algorithm B.

FIG. IO is an example graph of an extent specific IO write size distribution shown in the form of a histogram, and graphically illustrating setting an extent-specific size threshold for the respective extent, according to some embodiments.

Figure 11:
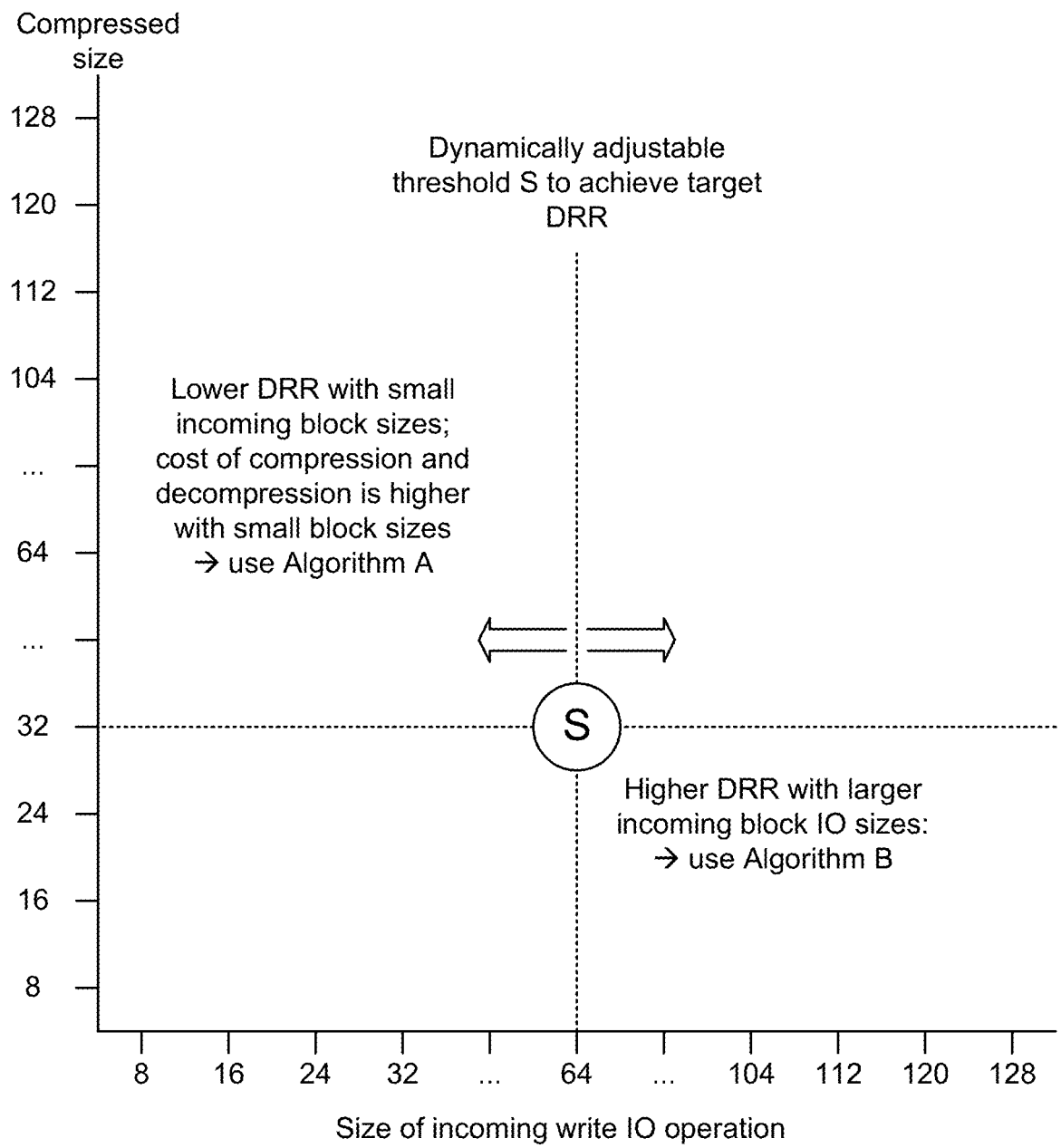

FIG. 11 is a graph comparing the size of incoming write IO operations against the compressed size, and showing adjustment of the threshold S to dynamically change the number of write operations that are compressed using either algorithm A or algorithm B, according to some embodiments.

Figure 12:
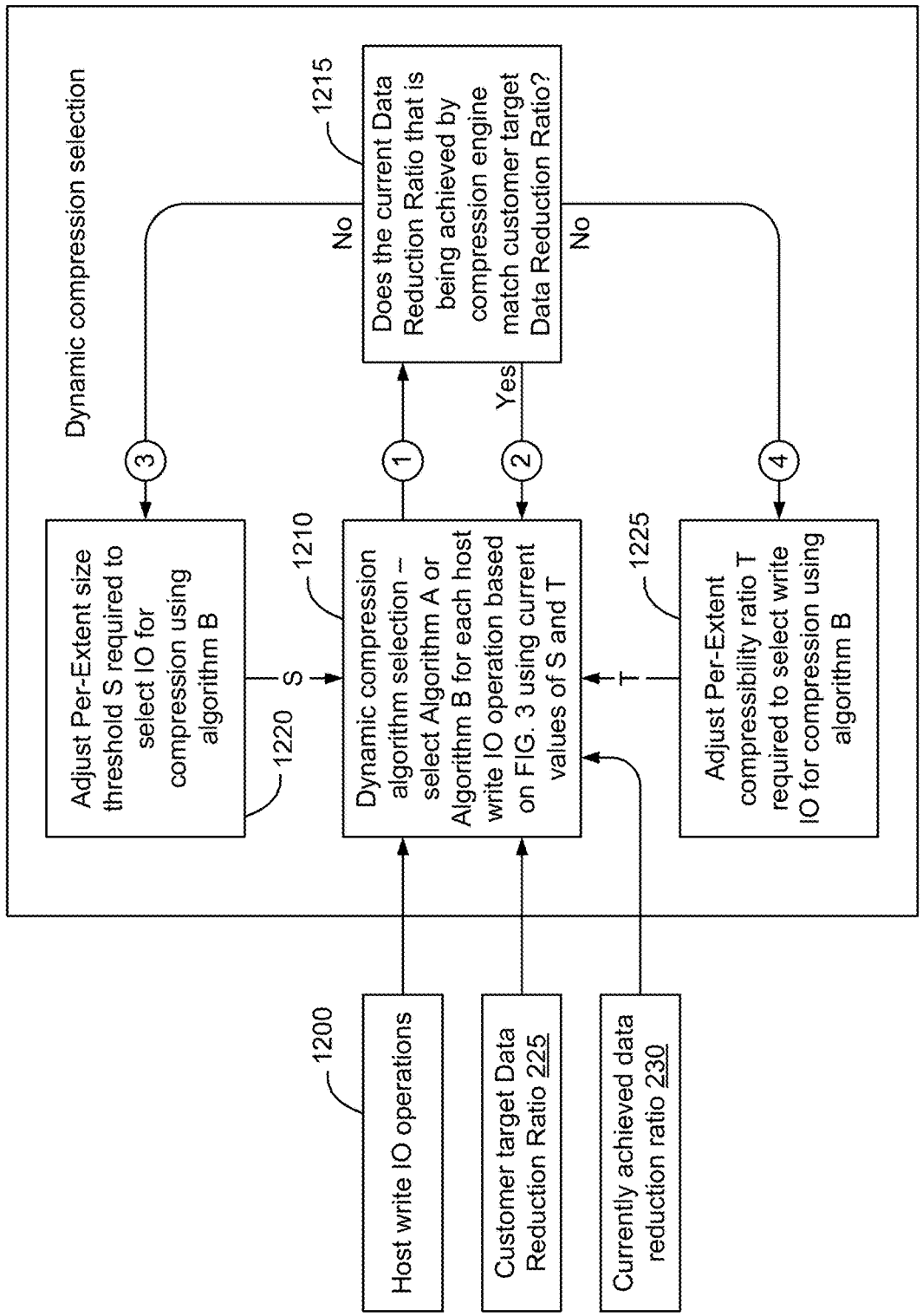

FIG. 12 is a block diagram of a system configured to dynamically adjust a write size threshold S and an extent compressibility characteristics threshold T to achieve a target data reduction ratio, according to some embodiments.

FIG. 13 is a flowchart of an example process of adjusting the threshold T, dynamically adjusting the threshold S, and/or dynamically adjusting both the threshold T and the threshold S, used by the compression engine to dynamically select between compression algorithm A and compression algorithm B, to cause the compression engine to cause the achieved data reduction ratio to correspond to a target data reduction ratio, according to some embodiments.

DETAILED DESCRIPTION

Aspects of the inventive concepts will be described as being implemented in a storage system 100 connected to a host computer 102. Such implementations should not be viewed as limiting. Those of ordinary skill in the art will recognize that there are a wide variety of implementations of the inventive concepts in view of the teachings of the present disclosure.

Some aspects, features and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory tangible computer-readable medium. Furthermore, it will be understood by those of ordinary skill in the art that the computer-executable instructions may be executed on a variety of tangible processor devices, i.e., physical hardware. For ease of exposition, not every step, device or component that may be part of a computer or data storage system is described herein. Those of ordinary skill in the art will recognize such steps, devices, and components in view of the teachings of the present disclosure and the knowledge generally available to those of ordinary skill in the art. The corresponding machines and processes are therefore enabled and within the scope of the disclosure.

The terminology used in this disclosure is intended to be interpreted broadly within the limits of subject matter eligibility. The terms "logical" and "virtual" are used to refer to features that are abstractions of other features, e.g., and without limitation, abstractions of tangible features. The term "physical" is used to refer to tangible features, including but not limited to electronic hardware. For example, multiple virtual computing devices could operate simultaneously on one physical computing device. The term "logic" is used to refer to special purpose physical circuit elements, firmware, and/or software implemented by computer instructions that are stored on a non-transitory tangible computer-readable medium and implemented by multi-purpose tangible processors, and any combinations thereof.

Figure 1:
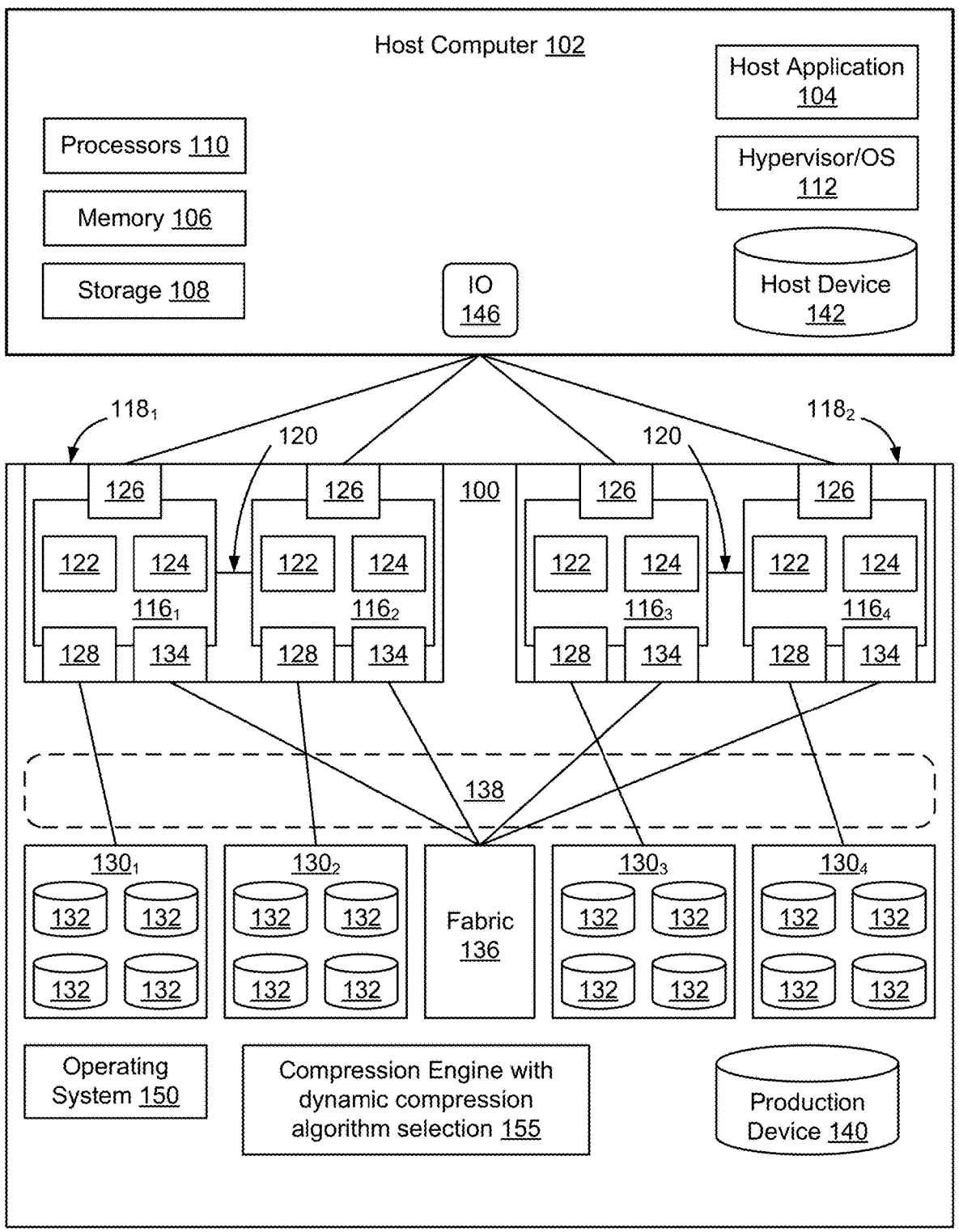
FIG. 1 is a functional block diagram of an example storage system connected to a host computer, according to some embodiments.

FIG. 1 illustrates a storage system 100 and an associated host computer 102, of which there may be many. The storage system 100 provides data storage services for a host application 104, of which there may be more than one instance and type running on the host computer 102. In the illustrated example, the host computer 102 is a server with host volatile memory 106, persistent storage 108, one or more tangible processors 110, and a hypervisor or OS (Operating System) 112. The processors 110 may include one or more multi-core processors that include multiple CPUs (Central Processing Units), GPUs (Graphics Processing Units), and combinations thereof. The host volatile memory 106 may include RAM (Random Access Memory) of any type. The persistent storage 108 may include tangible persistent storage components of one or more technology types, for example and without limitation SSDs (Solid State Drives) and HDDs (Hard Disk Drives) of any type, including but not limited to SCM (Storage Class Memory), EFDs (Enterprise Flash Drives), SATA (Serial Advanced Technology Attachment) drives, and FC (Fibre Channel) drives. The host computer 102 might support multiple virtual hosts running on virtual machines or containers. Although an external host computer 102 is illustrated in FIG. 1, in some embodiments host computer 102 may be implemented as a virtual machine within storage system 100.

The storage system 100 includes a plurality of compute nodes $116_1$-$116_4$, possibly including but not limited to storage servers and specially designed compute engines or storage directors for providing data storage services. In some embodiments, pairs of the compute nodes, e.g. ($116_1$-$116_2$) and ($116_3$-$116_4$), are organized as storage engines $118_1$ and $118_2$, respectively, for purposes of facilitating failover between compute nodes 116 within storage system 100. In some embodiments, the paired compute nodes 116 of each storage engine 118 are directly interconnected by communication links 120. In some embodiments, the communication links 120 are implemented as a PCIe NTB. As used herein, the term "storage engine" will refer to a storage engine, such as storage engines $118_1$ and $118_2$, which has a pair of (two independent) compute nodes, e.g. ($116_1$-$116_2$) or ($116_3$-$116_4$). A given storage engine 118 is implemented using a single physical enclosure and provides a logical separation between itself and other storage engines 118 of the storage system 100. A given storage system 100 may include one storage engine 118 or multiple storage engines 118.

Each compute node, $116_1$, $116_2$, $116_3$, $116_4$, includes processors 122 and a local volatile memory 124. The processors 122 may include a plurality of multi-core processors of one or more types, e.g., including multiple CPUs, GPUs, and combinations thereof. The local volatile memory 124 may include, for example and without limitation, any type of RAM. Each compute node 116 may also include one or more front-end adapters 126 for communicating with the host computer 102. Each compute node $116_1$-$116_4$ may also include one or more back-end adapters 128 for communicating with respective associated back-end drive arrays $130_1$-$130_4$, thereby enabling access to managed drives 132. A given storage system 100 may include one back-end drive array 130 or multiple back-end drive arrays 130.

In some embodiments, managed drives 132 are storage resources dedicated to providing data storage to storage system 100 or are shared between a set of storage systems 100. Managed drives 132 may be implemented using numerous types of memory technologies for example and without limitation any of the SSDs and HDDs mentioned above. In some embodiments the managed drives 132 are implemented using NVM (Non-Volatile Memory) media technologies, such as NAND-based flash, or higher-performing SCM (Storage Class Memory) media technologies such as 3D XPoint and ReRAM (Resistive RAM). Managed drives 132 may be directly connected to the compute nodes $116_1$-$116_4$, using a PCIe (Peripheral Component Interconnect Express) bus or may be connected to the compute nodes $116_1$-$116_4$, for example, by an IB (InfiniBand) bus or fabric.

In some embodiments, each compute node 116 also includes one or more channel adapters 134 for communicating with other compute nodes 116 directly or via an interconnecting fabric 136. An example interconnecting fabric 136 may be implemented using PCIe (Peripheral Component Interconnect Express) or InfiniBand. Each compute node 116 may allocate a portion or partition of its respective local volatile memory 124 to a virtual shared memory 138 that can be accessed by other compute nodes 116 over the PCIe NTB links.

The storage system 100 maintains data for the host applications 104 running on the host computer 102. For example, host application 104 may write data of host application 104 to the storage system 100 and read data of host application 104 from the storage system 100 in order to perform various functions. Examples of host applications 104 may include but are not limited to file servers, email servers, block servers, and databases.

Logical storage devices are created and presented to the host application 104 for storage of the host application 104 data. For example, as shown in FIG. 1, a production device 140 and a corresponding host device 142 are created to enable the storage system 100 to provide storage services to the host application 104.

The host device 142 is a local (to host computer 102) representation of the production device 140. Multiple host devices 142, associated with different host computers 102, may be local representations of the same production device 140. The host device 142 and the production device 140 are abstraction layers between the managed drives 132 and the host application 104. From the perspective of the host application 104, the host device 142 is a single data storage device having a set of contiguous fixed-size LBAs (Logical Block Addresses) on which data used by the host application 104 resides and can be stored. However, the data used by the host application 104 and the storage resources available for use by the host application 104 may actually be maintained by the compute nodes $116_1$-$116_4$ at non-contiguous addresses (tracks) on various different managed drives 132 on storage system 100.

In some embodiments, the storage system 100 maintains metadata that indicates, among various things, mappings between the production device 140 and the locations of extents of host application data in the virtual shared memory 138 and the managed drives 132. In response to an IO (Input/Output command) 146 from the host application 104 to the host device 142, the hypervisor/OS 112 determines whether the IO 146 can be serviced by accessing the host volatile memory 106. If that is not possible, then the IO 146 is sent to one of the compute nodes 116 to be serviced by the storage system 100.

In the case where IO 146 is a read command, the storage system 100 uses metadata to locate the commanded data, e.g., in the virtual shared memory 138 or on managed drives 132. If the commanded data is not in the virtual shared memory 138, then the data is temporarily copied into the virtual shared memory 138 from the managed drives 132 and sent to the host application 104 by the front-end adapter 126 of one of the compute nodes $116_1$-$116_4$. In the case where the IO 146 is a write command, in some embodiments the storage system 100 copies a block being written into the virtual shared memory 138, marks the data as dirty, and creates new metadata that maps the address of the data on the production device 140 to a location to which the block is written on the managed drives 132.

In some embodiments, the storage system includes a compression engine 155 that is configured to compress data prior to storing the data either in shared global memory 138 or in back-end storage resources 132. In some embodiments, the compression engine 155 is implemented as a compression hardware accelerator, that is configured to support multiple inline compression algorithms. Different compression algorithms may exhibit different characteristics. For example, a first compression algorithm (referred to herein as compression algorithm A), might be faster and use fewer hardware resources to implement, but might also generally result in a lower data reduction ratio. By contrast, a second compression algorithm (referred to herein as compression algorithm B), might take a longer amount of time and use a greater amount of hardware resources to implement, but might generally result in a higher data reduction ratio. As used herein, the term "data reduction ratio", also abbreviated DRR, is used to refer to the ratio of the size of a piece of data before compression relative to the size of the same piece of data after compression: DRR=original data size/compressed data size. For example, if a 100 kb piece of data is compressed to 50 kb, the DRR for the compression operation is DRR=2 (100/50=2). As another example, if the same 100 kb piece of data is compressed to 25 kb, the DRR for the compression operation is DRR=4 (100/25=4). Accordingly, a higher DRR correlates to enhanced compression, whereas a lower DRR correlates to less efficient compression.

According to some embodiments, by providing a compression engine 155 configured to select between multiple compression algorithms, it is possible to achieve a target data reduction ratio while minimizing consumption of the hardware resources of the compression engine 155, by focusing the use of the more efficient but computationally expensive compression algorithm (compression algorithm B) on write IO operations that are predicted to provide maximal benefit to the overall data reduction ratio achieved by the compression engine 155 and using the less computationally expensive compression algorithm (compression algorithm A) on the remaining write IO operations.

Figure 2:
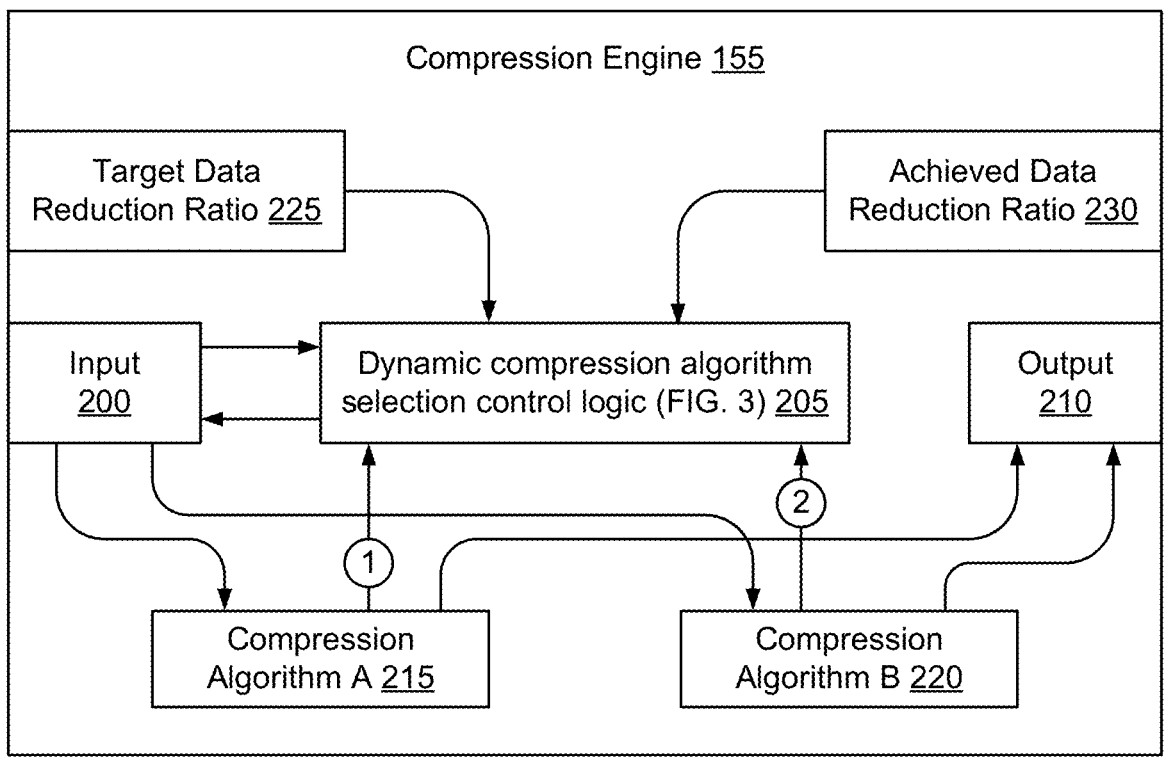
FIG. 2 is a block diagram of an example compression engine configured to implement dynamic selection between compression algorithms to achieve a target data reduction ratio, according to some embodiments.

FIG. 2 is a block diagram of an example compression engine 155 configured to implement dynamic selection between compression algorithms to achieve a target data reduction ratio, according to some embodiments. As shown in FIG. 2, in some embodiments, the compression engine 155 has an input 200 on which write IO operations are received for compression. The compression engine 155 includes a dynamic compression algorithm selection control logic 205. Some aspects of the dynamic compression algorithm selection control logic 205 are described in greater detail in connection with FIGS. 3-13. In dependence on a determination of which compression algorithm should be used to compress the received write operation, the received write operation is either compressed using hardware configured to implement compression algorithm A 215, or hardware configured to implement compression algorithm B 220. The compression engine 155 might have different hardware configured to implement the different compression algorithms, depending on the implementation. Upon completion of the compression process, the compressed write IO is passed to output 210 to be forwarded to a storage location in storage system 100. As shown in FIG. 2, in some embodiments the result of the compression is passed back to the compression selection control logic 205 (FIG. 2 arrows 1 and 2) to enable the compression selection control logic to update its algorithms based on the compressibility of the write IO, for use in connection with selecting between the compression algorithms for subsequent write IO operations.

As described herein, in some embodiments the dynamic compression algorithm selection control logic is configured to select between multiple compression algorithms that have different costs, in terms of use of computational resources to implement the compression process. The different compression algorithms also, on average, are able to achieve different computational outcomes in terms of differentiated data reduction ratios. However, the particular data reduction ratio achieved by each of the compression algorithms varies for each write operation. On a given write operation, compression algorithm A might achieve the same compression outcome (same DRR) as compression algorithm B.

As an example, in some embodiments compression algorithm A is implemented using ZLib Level 9 and compression algorithm B is implemented using XP10. XP10 is often able to provide 5-10% better compression than Level 9, however, XP10 takes considerably longer and uses more computational resources. It should be understood that the identification of these particular compression algorithms as examples of compression algorithms A and B are not intended to require the use of these particular compression algorithms, as other compression algorithms may be used to implement compression algorithms A and B depending on the implementation.

According to some embodiments, a method is provided to predict, on a per-extent basis, whether a write operation targeting a piece of data on that extent would be preferentially compressed using either compression algorithm A or compression algorithm B. By selectively implementing compression of particular write operations using compression algorithm B, when it is predicted to achieve a greater compression benefits, it is possible to increase the overall data reduction ratio achieved by the compression engine 155 while economizing the amount of resources expended by the compression engine 155.

Figure 3:
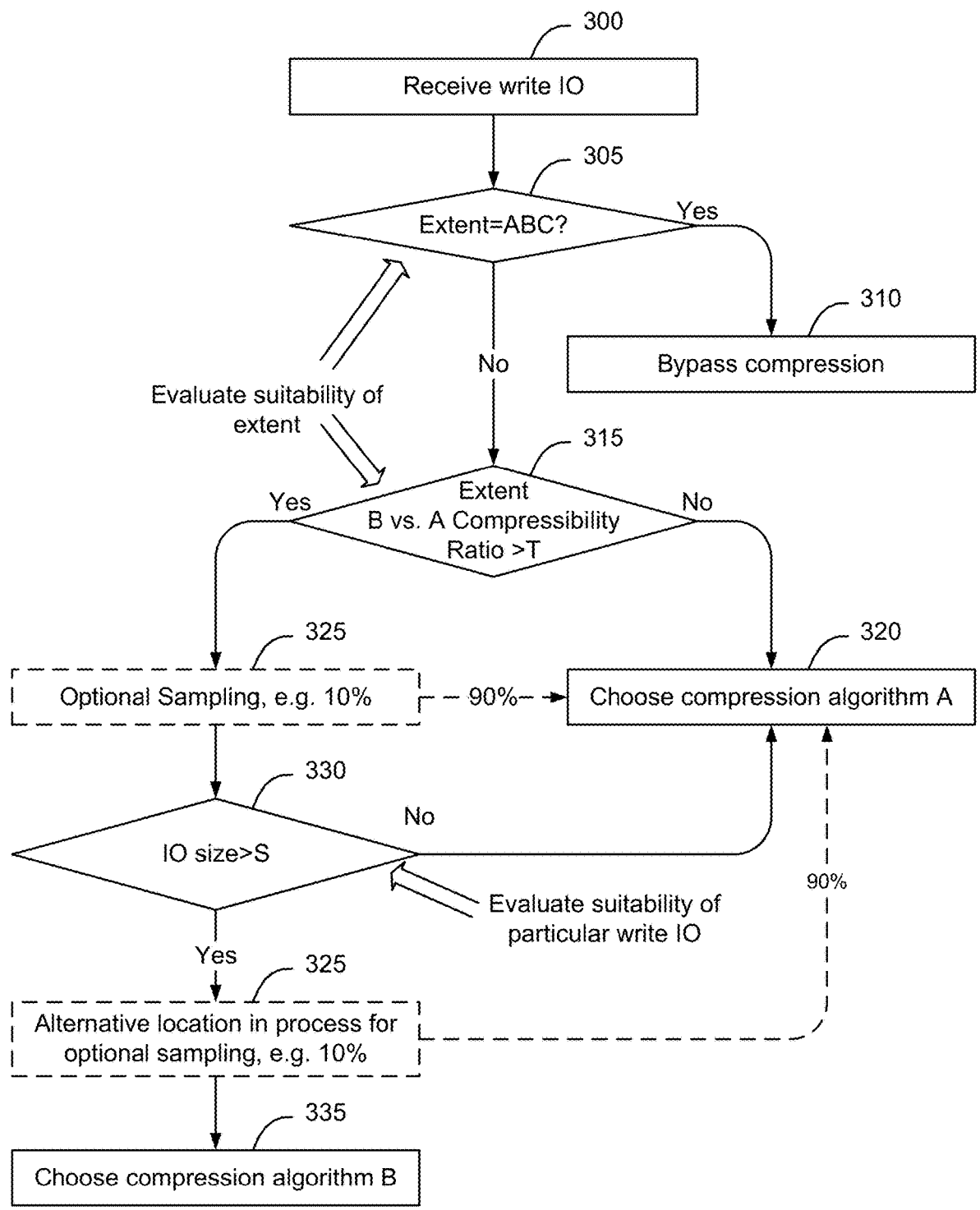
FIG. 3 is a flow chart of an example method of dynamic selection between compression algorithms to achieve a target data reduction ratio, according to some embodiments.

FIG. 3 is a flow chart of an example method of dynamic selection between compression algorithms implemented by the dynamic compression algorithm selection control logic of FIG. 2, to enable the compression engine 155 to cause an achieved data reduction ratio 230 to be adjusted to approximate a target data reduction ratio 225, according to some embodiments.

As used herein, the term "extent" is used to refer to a block allocation of memory by the storage system. For example, a storage system may allocate storage in extents having a size of 256 mb, or some other size. Write IO operations, by contrast, tend to target much smaller regions of memory. For example, a given write operation may be on the order of 8 kb, 32 kb, 128 kb, etc. As such, a given write IO will typically target a small region of an extent. As noted herein, in some embodiments a dynamic compression algorithm selection process is used to determine compression algorithm allocation for a given write operation, using metrics that are developed on a per-extent basis. Since the metrics used by the dynamic compression algorithm selection control logic are on a per-extent basis, the metrics developed for a given extent will apply to any write operation targeting a portion of the given extent.

As shown in FIG. 3, in some embodiments, when a write IO is received (block 300), a determination is made as to whether the write IO is to a portion of an extent that has been determined to be experiencing high IO activity (block 305). In some embodiments, the storage system 100 uses the concept of Activity Based Compression (ABC) to selectively retain a portion of the most frequently accessed extents in uncompressed form on the storage resources such as global memory 138 and back-end storage resources 132. By maintaining a portion of the most frequently accessed data in uncompressed form, it is possible to respond to IO requests targeting those extents without requiring that the data of the extents be compressed or uncompressed. As an example, a storage system may elect to keep 20% or some other percentage of the extents of data in uncompressed form in its storage resources.

Accordingly, in some embodiments, if a determination is made that the write IO is directed to an extent that has been determined to be above the ABC activity threshold to skip compression (a determination of YES in block 305), compression is bypassed (block 310). If the write IO is directed to an extent that has not been determined to be above the ABC activity threshold (a determination of NO in block 305), a determination is made as to whether the extent compressibility characteristics are such that the write IO should be considered for compression using compression algorithm B (block 315).

Specifically, in block 315 the dynamic compression algorithm selection control logic evaluates the compressibility characteristics of the extent, to determine if write operations on this particular extent should always be compressed using compression algorithm A, or whether this particular extent has exhibited compression characteristics that might warrant the use of compression algorithm B for this particular write operation.

For example, in some embodiments the compressibility characteristics of the extent are evaluated by determining whether an extent B vs. A compressibility ratio is above a threshold T (block 315). As used herein, the term "compressibility ratio" is used to refer to a comparison between the data reduction ratio achieved for write operations on the extent by using compression algorithm B vs. the data reduction ratio achieved for write operations on the extent using compression algorithm A. An example method of determining a per-extent compressibility ratio is described in connection with FIGS. 4-7. As an alternative to calculating a compressibility ratio for each extent, it is possible to also determine the overall compressibility of each extent, and use the threshold T to select extents that have an overall high data reduction ratio for compression using compression algorithm B. An example of the use of threshold T to select extents based on average compressibility is described in connection with FIG. 8.

Using threshold T, and either the extent average compressibility (FIG. 8) or the compressibility ratio calculated for the extent (FIGS. 4-7), a determination is made as to whether the compressibility characteristics of the extent exceeds the threshold T (block 315). If the compressibility characteristics of the extent do not exceed the threshold T (a determination of NO at block 315), compression algorithm A is chosen to implement compression on the write IO (block 320) and the characteristics of the write IO, such as the size of the write IO, are not further evaluated.

If the compressibility characteristics of the extent exceed the threshold T (a determination of YES at block 315), the characteristics of the write IO are evaluated to determine if compression of this particular write operation should be implemented using compression algorithm A or compression algorithm B (blocks 325-335).

In some embodiments, to determine whether a particular write IO should be compressed using compression algorithm A or compression algorithm B, a per extent size threshold S is created, and the size of the write IO is compared to the threshold S for that extent (block 330). In some embodiments, larger sized write IOs may compress more efficiently using compression algorithm B, for example in embodiments where the compression algorithm B uses a larger segment size than compression algorithm A. Additional details associated with determining the threshold S on a per-extent basis are described in connection with FIGS. 9-11. If the size of the write operation is above the threshold S that has been established for the respective extent (a determination of YES at block 330) compression algorithm B is selected for the write operation (block 335). If the size of the write operation is below the threshold S that has been established for the respective extent (a determination of NO at block 330) compression algorithm A is selected for the write operation (block 320).

As shown in FIG. 3, optionally sampling (block 325) may be used to select a portion of write operations to be evaluated for compression using compression algorithm B (sampling before block 330), or to select a portion of write operations that qualify for compression using compression algorithm B to actually be compressed using compression algorithm B (sampling after block 330).

For example, as shown in FIG. 3, if the write operation is on an extent and the compressibility characteristics of the extent exceed the threshold T (a determination of YES at block 315), in some embodiments a sampling is implemented (block 325) such that only a portion of the write IO operations are evaluated using the size evaluation process of block 330, whereas the remainder of write IOs are compressed using compression algorithm A (block 320). In this instance, the sampling (block 325) is implemented before block 330. In some embodiments, size evaluation is implemented prior to the sampling (sampling done after block 330), to select a percentage of write IOs that qualify for compression using algorithm B to actually be compressed using algorithm B. Sampling write operations, in some embodiments, is implemented to avoid overloading the hardware of the compression engine 155. As noted above, in some embodiments, compression algorithm B requires more hardware resources than compression algorithm A. By selecting a subset of write IOs for compression using compression algorithm B, it is possible to reduce the amount of work required of the compression engine 155. Optionally, the sampling percentage may be adjustable to enable further tuning of the overall data reduction ratio achieved by the dynamic compression process described herein. Although FIG. 3 shows an example sampling percentage of 10%, it should be understood that the particular sampling percentage will depend on the particular implantation.

Figure 4:
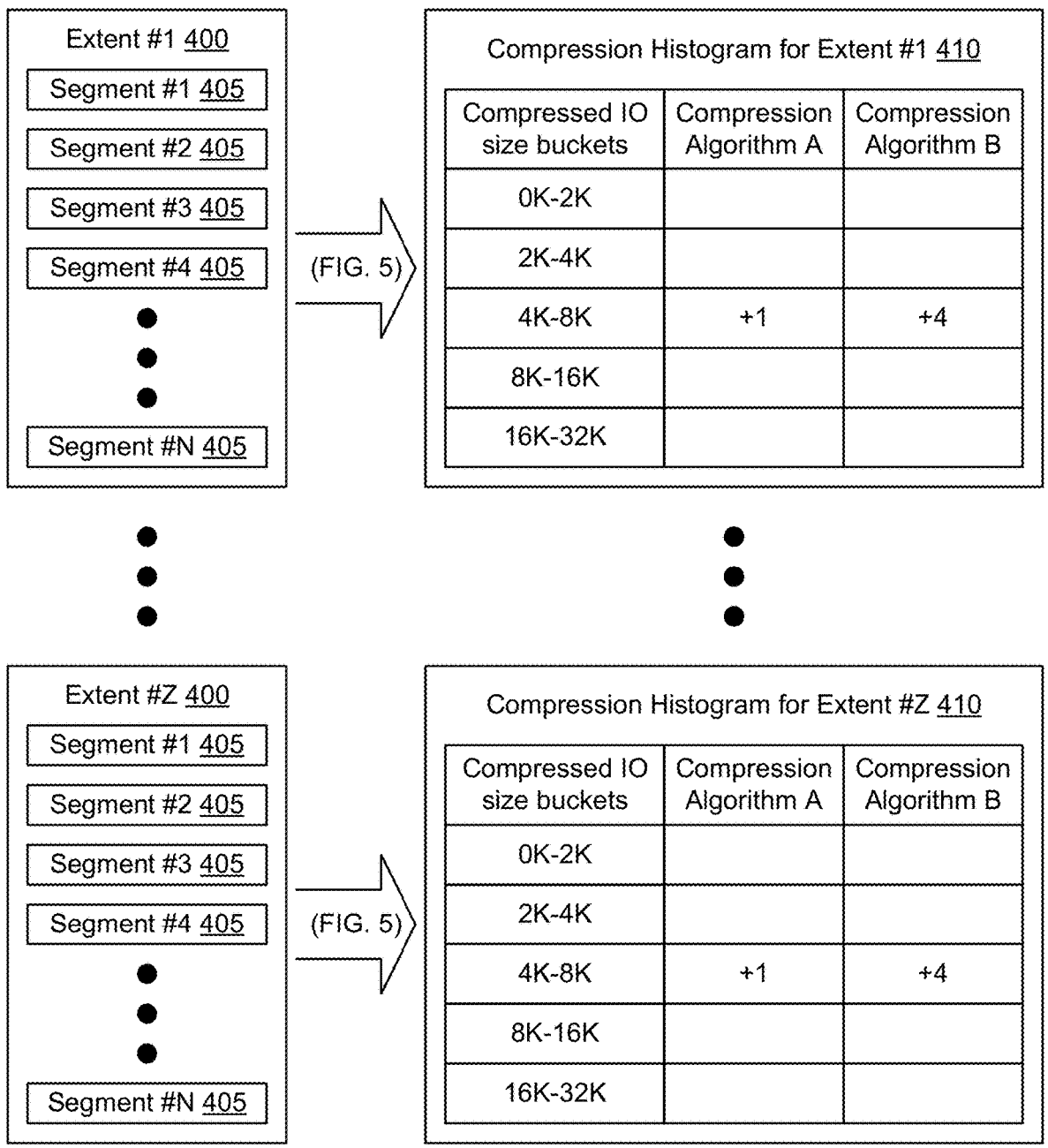
FIG. 4 is a block diagram graphically illustrating creation of a set of compression histograms for use in setting a threshold T, in which the threshold T is based on an extent compressibility ratio, for use in the example method of dynamic selection between compression algorithms to achieve a target data reduction ratio of FIG. 3, according to some embodiments.

FIG. 4 is a block diagram graphically illustrating creation of a set of compression histograms for use in setting a threshold T, in which the threshold T is based on an extent compressibility ratio, for use in the example method of dynamic selection between compression algorithms to achieve a target data reduction ratio of FIG. 3, according to some embodiments. Specifically, as noted above in connection with FIG. 3, in some embodiments a per-extent compressibility or compression ratio is determined for each extent such that, when a write IO is received that is directed to a portion of a respective extent, it is possible to determine the overall compressibility or compressibility ratio for the extent to determine whether this write IO is directed to an extent that has historically exhibited good compression characteristics (block 315).

Accordingly, as shown in FIG. 4, in some embodiments each extent 400 includes multiple segments of data 405. The term "segment" 405 is intended to be a generic name for a piece of data of arbitrary size. In some embodiments, a segment of data 405 is a piece of data that corresponds to a maximum write IO size. In some embodiments, a segment of data 405 is a piece of data that corresponds to a segment size of one of the compression algorithms.

In some embodiments, compression algorithm A uses a 32 kb segment size, and compression algorithm B uses a 128 kb segment size, although different compression algorithms may use other segment sizes depending on the implementation. If a write IO is received that is smaller than the segment size used by the selected compression algorithm, data is read from the back-end storage resources to fill the segment prior to sending the data to the compression engine 155.

To determine the compressibility or compression ratio of each extent, in some embodiments for each extent 400, a histogram 410 of compressed segment sizes is created. In some embodiments, each time a write operation occurs on a segment 405, the data associated with the write operation is compressed using either compression algorithm A or compression algorithm B, and the compressed size of the resulting write operation is determined. The corresponding compressed IO size bucket of the histogram is then updated to reflect the compression result. For example, if compression algorithm A is used to compress a 32 kb write IO to between 8 kb and 4 kb, the 8 kb compressed size bucket of the histogram is incremented. If compression algorithm B is used to compress a write IO, since compression algorithm B in this example uses a 128 kb segment size, the size of the compressed data is normalized to account for the larger segment size used by compression algorithm B. In this example, since compression algorithm B uses a 128 kb size, and compression algorithm A uses a 32 kb segment size, the size of the compressed data is normalized by dividing the resultant compressed size by four (128/32) to identify the compression bucket of the histogram, and then the selected bucket is incremented by four to account for the fact that a larger amount of data was compressed. For example, if a 128 kb write IO is compressed using compression algorithm B to a 32 kb compressed size, the resulting compressed data is divided by the ratio of the segment sizes (segment size B/segment size A=128 kb/32 kb=4) to identify the 8 kb bucket of the histogram. The 8 kb bucket is then incremented by four, as shown in FIG. 4 to account for the fact that the segment used by compression algorithm B is four times the size as the segment size used by compression algorithm A.

As shown in FIG. 3, in some embodiments, compression algorithm A and compression algorithm B are selected, depending on the compression characteristics of the extent and the characteristics of the write IOs. In some embodiments, if compression algorithm A is initially selected to compress a particular write IO, and the write IO has been stored in storage resources for a period of time such as a few weeks, the write IO may be recompressed using compression algorithm B. In some embodiments, the histogram is also populated whenever segments of the extent are recompressed, to enable the results of the recompression process to be included in the histogram for the extent.

In some embodiments, as shown in FIG. 4, each histogram separately keeps track of compression operations implemented using compression algorithm A and compression algorithm B. This enables a compressibility ratio to be determined, on a per-extent basis, which compares the compressibility of the extent using each of the compression algorithms. Accordingly, as shown in FIG. 4, in some embodiments the per-extent compressibility histogram is implemented such that there are two separate values maintained for each size range bucket of the histogram.

Figure 5:
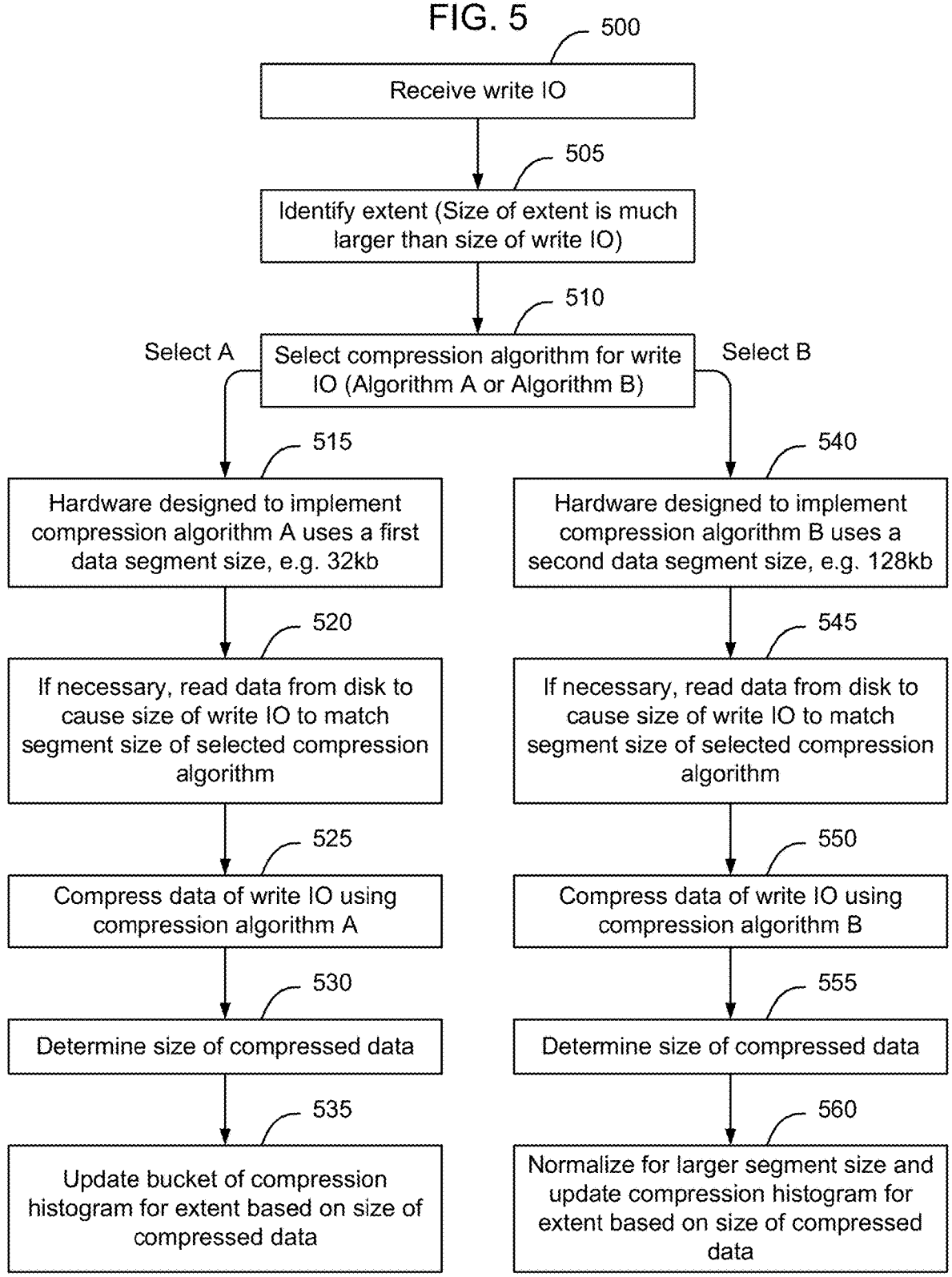
FIG. 5 is a flow chart of an example method of populating the compression histograms of FIG. 4, according to some embodiments.

FIG. 5 is a flow chart of an example method of populating the compression histograms of FIG. 4, according to some embodiments. As shown in FIG. 5, in some embodiments when a write IO is received (block 500), the extent associated with the write IO is identified (block 505). In some embodiments, the extent is much larger than a typical write IO operation. For example, an extent might be on the order of 256 mb, whereas a write might have a smaller size, such as on the order of 32 kb or 128 kb. A compression algorithm is then selected for the write IO (block 510), for example using the process described above in connection with FIG. 3.

If compression algorithm A is selected (arrow labeled "select A" at block 510), the hardware designed to implement compression algorithm A is provided with the write IO. In some embodiments, compression algorithm A is configured to compress a fixed segment size, such as a 32 kb segment size (block 515). Accordingly, if the write IO is not 32 kb in size, data is read from disk to cause the size of the write IO to match the segment size of the selected compression algorithm (block 520). The write IO is then compressed using compression algorithm A (block 525) and the size of the compressed data is determined (block 530). The bucket of the histogram for the associated extent that corresponds to the size of the compressed data is incremented (block 535) and the process ends.

If compression algorithm B is selected (arrow labeled "select B" at block 510), the hardware designed to implement compression algorithm B is provided with the write IO. In some embodiments, compression algorithm B is configured to compress a fixed segment size, such as a 128 kb segment size (block 540). Accordingly, if the write IO is not 128 kb in size, data is read from disk to cause the size of the write IO to match the segment size of the selected compression algorithm (block 545). The write IO is then compressed using compression algorithm B (block 550) and the size of the compressed data is determined (block 555). The compressed data size is then normalized to account for the larger segment size used by compression algorithm B, the bucket of the histogram for the associated extent that corresponds to the size of the compressed data is incremented (block 560), and the process ends. As noted above, in some embodiments the difference in segment sizes is normalized in connection with both selection of the proper bucket and in connection with determining how much the selected bucket should be incremented.

Figure 6:
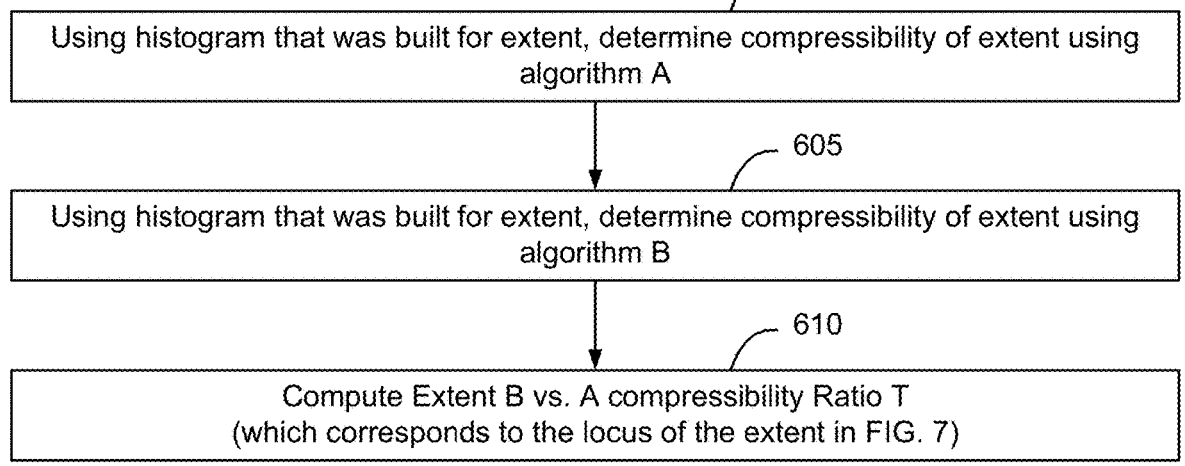
FIG. 6 is a flow chart of an example method of using one of the compression histograms of FIG. 4 to determine a compressibility ratio for the associated extent, according to some embodiments.

FIG. 6 is a flow chart of an example method of using one of the compression histograms of FIG. 4 to determine a compressibility ratio for the associated extent, according to some embodiments. As shown in FIG. 6, in some embodiments the histogram that was built for an extent is selected, and used to determine a compressibility of the extent using algorithm A (block 600). In some embodiments, the compressibility is determined by calculating the overall data reduction ratio of the extent as a weighted average data reduction. For example, in the histogram shown in FIG. 4, it is assumed that the compression algorithms are implementing compression on segment sizes that are 32 kb or 128 kb. By summing the number of write IOs that compressed into each of the buckets times the size of the buckets, and then dividing by the total number of write IOs times 32 kb, it is possible to calculate an overall data reduction ratio for the extent. For example, assume that there were 100 write IOs in each of the buckets of the histogram shown in FIG. 4 for compression algorithm A, and that compression algorithm A uses a segment size=32 kb. The data reduction ratio for the extent, when compression algorithm A is used to compress write operations, is calculated as:

$$(100 \times 2kb + 100 \times 4kb + 100 \times 8kb + 100 \times 16kb + 100 \times 32kb)/500 \times 32kb = .225$$

Accordingly, in this example, the data reduction ratio for the extent using compression algorithm A is 0.225. It should be understood that other ways of calculating data reduction ratios from the compression histograms are also possible, and the particular way of calculating the data reduction ratio will depend on the particular implementation.

As shown in FIG. 6, in some embodiments the histogram that was built for an extent is also used to determine a compressibility of the extent using algorithm B (block 605). In some embodiments, the same calculations that were used to determine the compressibility of the extent for compression algorithm A are used to also determine the compressibility of the extent for compression algorithm B. A compressibility ratio is then computed (block 610) which compares the compressed size of the extent using compression algorithm B to the compressed size of the extent using compression algorithm A.

Figure 7:
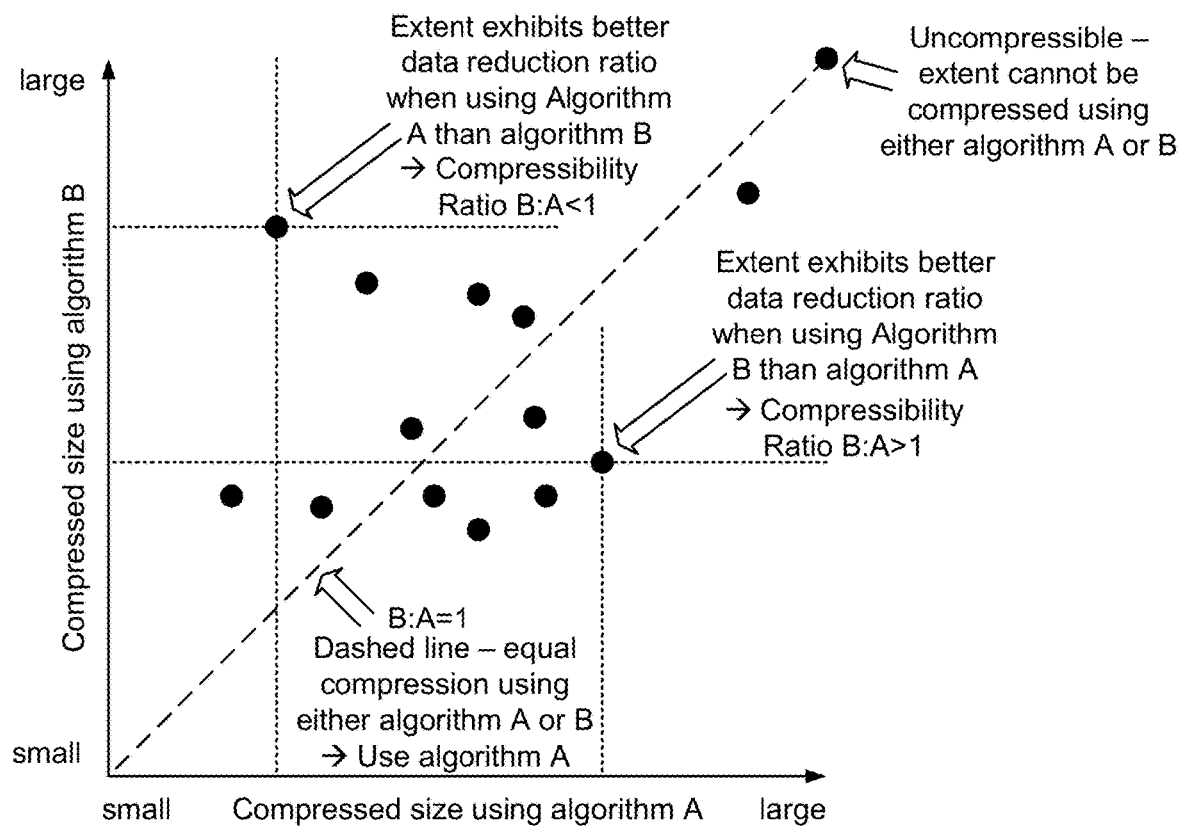
FIG. 7 is graph comparing the compressed size of extents when compressed using compression algorithm A with the compressed size of the same extents when compressed using compression algorithm B, in which each dot represents the compression characteristics of a particular extent, according to some embodiments.

FIG. 7 is graph comparing the compressed size of extents when compressed using compression algorithm A with the compressed size of the same extents when compressed using compression algorithm B, in which each dot represents the compression characteristics of a particular extent, according to some embodiments. In FIG. 7, the X axis shows the compressed size of the extent when the write IOs of the extent were compressed using compression algorithm A, and the Y axis shows the compressed size of the extent when the write IOs on the extent were compressed using compression algorithm B. Extents that are on or close to the dashed line exhibited equal or roughly equal compressed sizes using either compression algorithm. Since compression algorithm A requires fewer resources to implement, in some embodiments extents that are on or close to the dashed line are preferentially compressed using compression algorithm A. Extents that are plotted above the dashed line exhibit better data reduction ratio when using compression algorithm A than compression algorithm B and, accordingly, any write IOs on those extents are preferentially compressed using compression algorithm A. Extents that are plotted below the dashed line compressed to a smaller size using compression algorithm B than compression algorithm A and, accordingly, write operations on those extents are candidates to have compression algorithm B selected for initial compression. By comparing the compressibility of the extent using both compression algorithm A and compression algorithm B, it is possible to determine whether use of compression algorithm B is likely to yield a substantially better data reduction ratio and, hence, whether it is worth expenditure of the additional hardware resources to perform the initial compression process on the write IO using compression algorithm B.

Figure 8:
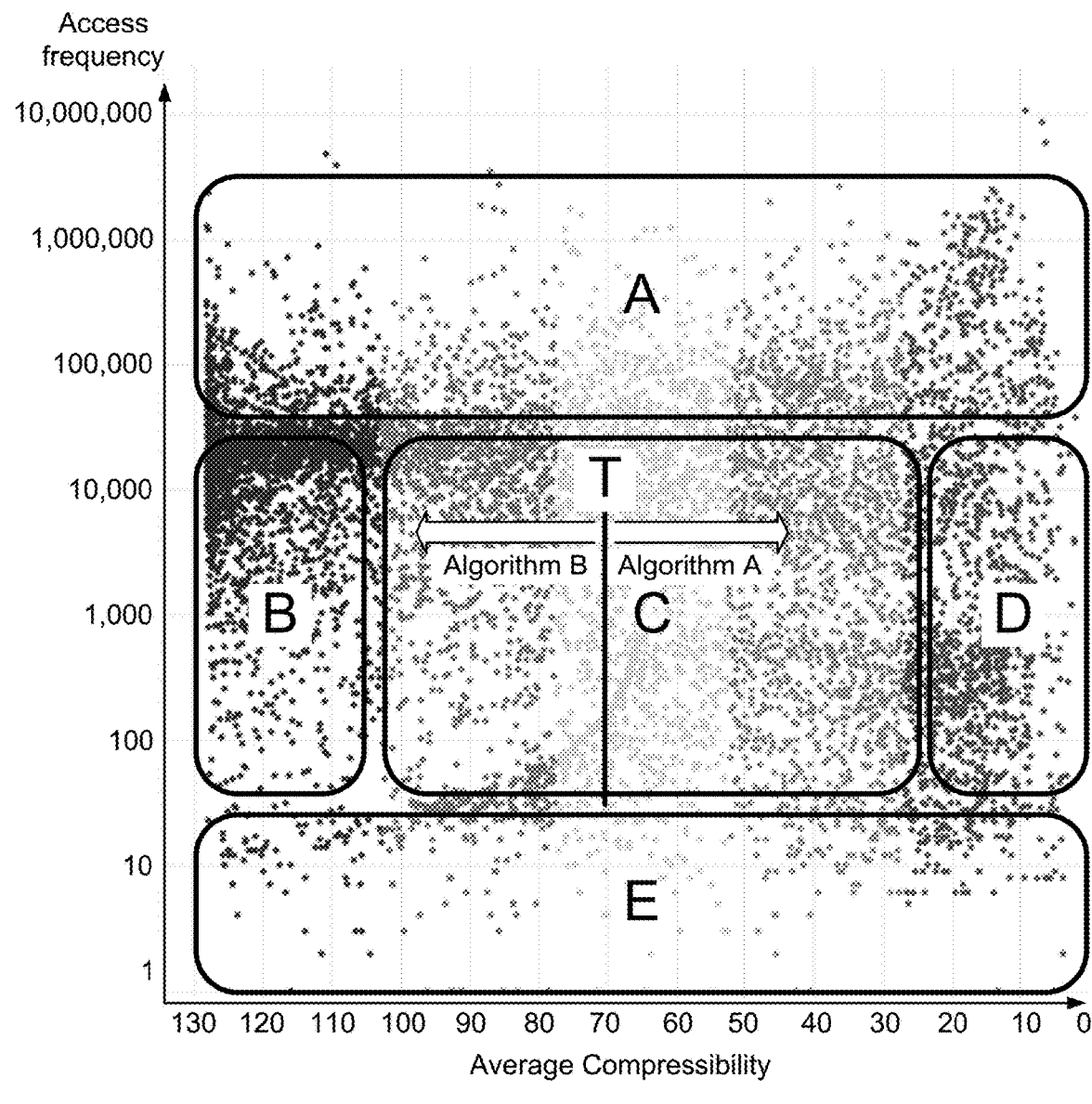
FIG. 8 is a graph comparing the average compressibility of extents with the access frequency of extents, and showing adjustment of the threshold T based on the average extent compressibility, according to some embodiments.

FIG. 8 is a graph comparing the average compressibility of extents with the access frequency of extents, and showing adjustment of the threshold T based on the average extent compressibility, according to some embodiments. In FIG. 8, the average compressibility of an extent is plotted on the X axis, and the access frequency of the extent is plotted on the Y axis. Extents that are located in region A are determined to be exhibiting high extent activity. In some embodiments, the storage system maintains a portion of the extents in uncompressed form and, accordingly, due to the high extent activity, the extents located in region A are selected to bypass compression.

Extents located in region E, by contrast, are exhibiting low extent activity. Since these extents are infrequently accessed, in some embodiments compression algorithm B is always used to compress these extents, under the assumption that the extents will exhibit at least some degree of enhanced data reduction ratio using compression algorithm B, as compared to the data reduction ratio that could be achieved using compression algorithm A. As noted above, in some embodiments, segments are selected to be recompressed using compression algorithm B if they were initially compressed using compression algorithm A and have not been accessed for a particular period of time, e.g., 20 days. By initially compressing write operations using compression algorithm B on extents that are relatively inactive, it is possible to avoid this decompression/recompression process thus resulting in additional overall reduction in consumption of compression engine resources.

Extents that are contained in region B are determined to have a high data reduction ratio. In some embodiments, the extents in this region are always compressed using compression algorithm B, under the assumption that the extents will exhibit at least some degree of enhanced data reduction ratio using compression algorithm B, as compared to the data reduction ratio that could be achieved using compression algorithm A.

Extents that are contained in region D are determined to have a low data reduction ratio. In some embodiments, the extents in this region are always compressed using compression algorithm A, under the assumption that the extents will not exhibit a significantly enhanced data reduction ratio using compression algorithm B, as compared to the data reduction ratio that could be achieved using compression algorithm A.

Extents that are contained in region C are compressed either using compression algorithm A or compression algorithm B, depending on the compressibility threshold T. Extents that are to the left of the threshold T (more highly compressible) are compressed using compression algorithm B, whereas extents that are to the right of the threshold T (less compressible) are compressed using compression algorithm A. By adjusting the threshold T it is possible to adjust which extents are selected for compression using compression algorithm B.

Figure 9:
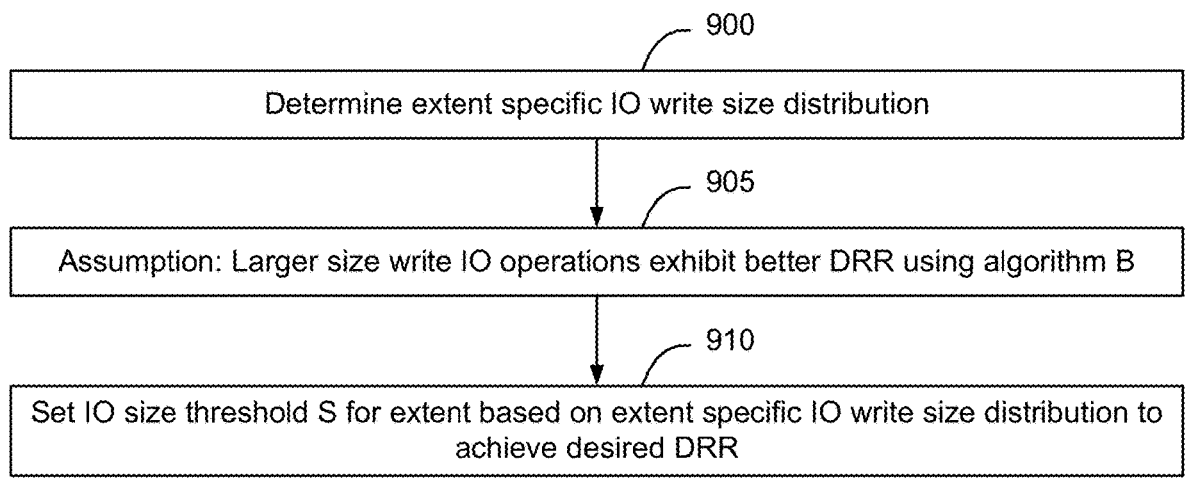
FIG. 9 is a flow chart of an example method of setting an extent-specific size threshold S for use in the example method of dynamic selection between compression algorithms to achieve a target data reduction ratio of FIG. 3, according to some embodiments.
Figure 10:
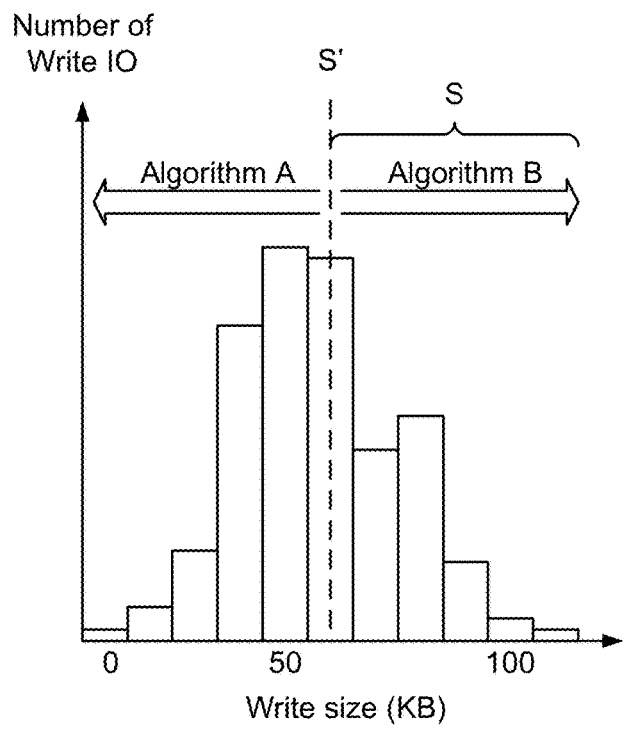

As noted in connection with FIG. 3, in some embodiments a per-extent size threshold is selected and used in block 330 to select particular write IO operations to be compressed using compression algorithm B. FIG. 9 is a flow chart of an example method of setting an extent-specific size threshold S for use in the example method of dynamic selection between compression algorithms to achieve a target data reduction ratio of FIG. 3, according to some embodiments. As shown in FIG. 9, in some embodiments the compression engine 155 determines an extent specific IO write size distribution for each extent (block 900). In some embodiments, the extent specific IO write size distribution refers to the size of the write IO operations that are received on the extent prior to compression. FIG. IO is an example graph of an extent specific IO write size distribution shown in the form of a histogram, and graphically illustrating setting an extent-specific size threshold S for the respective extent, according to some embodiments.

In some embodiments, selecting larger sized write IOs for compression using compression algorithm B is based on an assumption that the larger size write IO operations exhibit better data reduction ratio using compression algorithm B (block 905). This may be based, in part, on the larger data segment size used by compression algorithm B (128 kb) than the relatively smaller data segment size used by compression algorithm A (32 kb). Based on the extent specific IO write size distribution, the IO size threshold S is set for the extent to achieve the overall desired data reduction ratio (block 910). For example, assume that the overall desired data reduction ratio requires 30% of all write operations to be selected for compression using compression algorithm B. In some embodiments, the extent specific IO write size distribution are used to determine a threshold size S such that 30% of the historic write operations on the extent are above the extent specific size threshold. Based on the extent specific IO write size distribution, it is possible to determine a write size that is selected, for the particular extent, such that 30% of the historic write operations were larger than the selected write size. Using this process, an extent-specific write size value S' is then set for the extent to enable future write IO operations to be selected for compression using compression algorithm B. By setting the threshold S, and calculating extent specific values S' based on the extent specific IO write size distribution, it is possible to distribute compression operations implemented using compression algorithm B more evenly across the extents, such that at least some write operations of each of the extents will fall above the per-extent size threshold S and be candidate write IO operations that may be selected for compression using compression algorithm B.

FIG. 11 is a graph comparing the size of incoming write IO operations against the compressed size, and showing adjustment of the threshold S to dynamically change the number of write operations that are compressed using either algorithm A or algorithm B, according to some embodiments. As shown in FIG. 11, in some embodiments a lower data reduction ratio is expected to be achieved with smaller incoming block sizes. In embodiments where the cost of compression is higher using compression algorithm B than compression algorithm A, it is preferable to use compression algorithm A to compress write IOs that are smaller than the size threshold S. Conversely, in embodiments where a higher data reduction ratio can be achieved by using compression algorithm B to compress write IOs, in instances where the size of a write IO is larger than the selected size threshold S, it is preferable to compress the write IO using compression algorithm B.

FIG. 12 is a block diagram of a system configured to dynamically adjust a write size threshold S and an extent compressibility characteristics threshold T to achieve a target data reduction ratio, according to some embodiments. As shown in FIG. 12, in some embodiments, dynamic compression selection is used to adjust the per-extent size thresholds S and the per-extent compressibility thresholds T to achieve a customer target data reduction ratio. In some embodiments, the dynamic compression selection process shown in FIG. 12 is implemented in control logic 205 of the compression engine 155.

As shown in FIG. 12, in some embodiments host write IO operations 1200 are received by the dynamic compression selection process, and a customer target data reduction ratio 1205 is also specified to the dynamic compression selection process. Based on the current values of the size threshold S and the extent-specific compressibility threshold T, write IO operations 1200 are dynamically assigned at block 1210 to be compressed using compression algorithm A or compression algorithm B using the process described in connection with FIG. 3.

Compressing data will cause the dynamic compression selection process to achieve a particular data reduction ratio 230. Periodically, a determination is made by block 1215 as to whether the achieved data reduction ratio 230 matches the customer target data reduction ratio 225 (arrow 1). If the achieved data reduction ratio 230 matches the customer target data reduction ratio 225 (a determination of YES), no adjustment is required of the thresholds S and T (arrow 2). If the achieved data reduction ratio 230 does not match the customer target data reduction ratio 225 (a determination of NO), the thresholds S and T are adjusted (arrows 3 and 4) (blocks 1220, 1225) to adjust the quantity of write IOs that are selected using compression algorithm B, or to adjust the percentage of write IOs that are compressed using compression algorithm B vs. compression algorithm A. For example, if the achieved data reduction ratio 230 exceeds the customer target data reduction ratio 225, the thresholds S and/or T may be increased to select fewer write IOs for compression using compression algorithm B, thus reducing the amount of work on the compression engine 155 and reducing the achieved data reduction ratio 230. By contrast, if the achieved data reduction ratio 230 is below the customer target data reduction ratio 225, the thresholds S and/or T may be decreased to select a larger number of write IOs for compression using compression algorithm B, to thereby increase the achieved data reduction ratio 230.

FIG. 13 is a flowchart of an example process of adjusting the threshold T, dynamically adjusting the threshold S, and/or dynamically adjusting both the threshold T and the threshold S, used by the compression engine 155 to dynamically select between compression algorithm A and compression algorithm B, to cause the compression engine 155 to cause the achieved data reduction ratio 230 to correspond to a target data reduction ratio 225, according to some embodiments. As shown in FIG. 13, in some embodiments the current data reduction ratio 230 that is being achieved by the compression engine 155 with dynamic compression algorithm selection 155 is determined and compared with the target data reduction ratio 225 (block 1300).

In response to a determination that the current data reduction ratio 230 is sufficiently close to the target data reduction ratio 225 (a determination of YES at block 1305), the current thresholds S and T are maintained by not changing the write IO size threshold S (block 1310) and not changing the compression ratio threshold T (block 1315).

In response to a determination that the current data reduction ratio is larger than the target data reduction ratio 225 (a determination of YES at block 1320), one or both of the current thresholds S and T are changed to select a smaller number of write IO operations for compression using compression algorithm B. For example, as shown in FIG. 13, in some embodiments the write IO size threshold S is increased to select fewer write IOs for compression using compression algorithm B (block 1325). Alternatively, in some embodiments the extent A vs. B compression ratio threshold T is increased to select fewer write IOs for compression using compression algorithm B (block 1330). Alternatively, in some embodiments both the write IO size threshold S and the extent A vs. B compression ratio threshold T are increased to select fewer write IOs for compression using compression algorithm B (block 1335).

In response to a determination that the current data reduction ratio 230 is lower than the target data reduction ratio 225 (a determination of YES at block 1340), one or both of the current thresholds S and T are changed to select a larger number of write IO operations for compression using compression algorithm B. For example, as shown in FIG. 13, in some embodiments the write IO size threshold S is decreased to select a larger number of write IOs for compression using compression algorithm B (block 1345). Alternatively, in some embodiments the extent A vs. B compression ratio threshold T is decreased to select a larger number of write IOs for compression using compression algorithm B (block 1350). Alternatively, in some embodiments both the write IO size threshold S and the extent A vs. B compression ratio threshold T are decreased to select a larger number of write IOs for compression using compression algorithm B (block 1355).

By dynamically compressing data using either compression algorithm A or compression algorithm B, it is possible to reduce the amount of compression resources required to implement compression in a storage system. Specifically, in some embodiments because compression algorithm A is relatively faster and requires less hardware resources to implement, in some cases data would always be compressed using algorithm A and then, after a period of time, a background process would be used to recompress the data using algorithm B. This required the previously compressed data to be decompressed using algorithm A, and then recompressed using algorithm B, to achieve enhance data reduction ratio provided using algorithm B. However, this resulted in the use of significant additional resources, since computational resources would be required to both decompress the data and then recompress the data using algorithm B. Further, the amount of additional data reduction that would be achieved by decompressing and recompressing the data using algorithm B would not be known in advance, and might only result in nominal additional data reduction ratio.

The dynamic selection process described herein enables individual write IO operations to be compressed at the outset using a dynamically selected compression algorithm, which balances the preferability of using algorithm A from the standpoint of conserving compression resources against the preferability of using algorithm B to optimize the data reduction ratio. By considering the compressibility or compressibility ratio, on a per-extent basis, and setting size thresholds on a per-extent basis, the dynamic selection process is able to use compression algorithm B for write IO operations that are likely to be significantly more compressible using algorithm B, and is able to use compression algorithm A for write IO operations that are relatively small and, accordingly, more closely in line with the sector size used by compression algorithm A.

The methods described herein may be implemented as software configured to be executed in control logic such as contained in a CPU (Central Processing Unit) or GPU (Graphics Processing Unit) of an electronic device such as a computer. In particular, the functions described herein may be implemented as sets of program instructions stored on a non-transitory tangible computer readable storage medium. The program instructions may be implemented utilizing programming techniques known to those of ordinary skill in the art. Program instructions may be stored in a computer readable memory within the computer or loaded onto the computer and executed on computer's microprocessor. However, it will be apparent to a skilled artisan that all logic described herein can be embodied using discrete components, integrated circuitry, programmable logic used in conjunction with a programmable logic device such as a FPGA (Field Programmable Gate Array) or microprocessor, or any other device including any combination thereof. Programmable logic can be fixed temporarily or permanently in a tangible non-transitory computer readable medium such as random-access memory, a computer memory, a disk drive, or other storage medium. All such embodiments are intended to fall within the scope of the present invention.

Throughout the entirety of the present disclosure, use of the articles "a" or "an" to modify a noun may be understood to be used for convenience and to include one, or more than one of the modified noun, unless otherwise specifically stated. The term "about" is used to indicate that a value includes the standard level of error for the device or method being employed to determine the value. The use of the term "or" in the claims is used to mean "and/or" unless explicitly indicated to refer to alternatives only or the alternatives are mutually exclusive, although the disclosure supports a definition that refers to only alternatives and to "and/or." The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and also covers other unlisted steps.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method of dynamic selection between compression algorithms to achieve a target data reduction ratio, comprising:

computing a per-extent compressibility ratio for each extent of data stored on a storage system, the per-extent compressibility ratio comparing a first compressibility of segments of data of the respective extent when compressed using compression algorithm A and a second compressibility of segments of data of the respective extent when compressed using compression algorithm B;

receiving write operations, each write operation being directed to a respective portion of a segment of a respective extent;

for each write operation:
determining whether data of the write operations should be compressed;

in response to determining that the data of the write operation should not be compressed, storing the data of the write operation in uncompressed form in storage; and in response to determining that the data of the write operation should be compressed:

determining a respective compressibility ratio for the respective extent;

comparing the compressibility ratio for the respective extent with a dynamically adjustable extent compressibility ratio threshold value;

in response to a determination that the compressibility ratio for the respective extent indicates that the extent exhibits greater compressibility using compression algorithm B than using compression algorithm A, comparing a size of the respective write operation to a dynamically adjustable write IO size threshold value;

in response to a determination that the size of the respective write operation is larger than the dynamically adjustable write IO size threshold value, compressing data of the respective write operation using compression algorithm B; and in response to a determination that the compressibility ratio for the respective extent indicates that the extent does not exhibit greater compressibility using compression algorithm B than using compression algorithm A, or in response to a determination that the size of the respective write operation is smaller than the dynamically adjustable write IO size threshold value, compressing data of the respective write operation using compression algorithm A.

2. The method of claim 1, wherein compression algorithm A is faster and less computationally intensive than compression algorithm B, and wherein compression algorithm A on average results in a lower data reduction ratio than compression algorithm B.

3. The method of claim 1, wherein compression algorithm A is more computationally efficient at compressing smaller sized write operations than compression algorithm B, and wherein compression algorithm B is more computationally efficient at compressing larger sized write operations than compression algorithm A.

4. The method of claim 1, wherein computing a per-extent compressibility ratio for each extent of data comprises maintaining a per-extent compressibility histogram for each extent, the per-extent compressibility histogram containing a plurality of compression size buckets for each compression algorithm, and populating the buckets of the per-extent compressibility histogram in connection with compressing data of write operations on segments of data of the respective extent.

5. The method of claim 1, wherein in response to a determination that the compressibility ratio for the respective extent indicates that the extent exhibits greater compressibility using compression algorithm B than using compression algorithm A, the method further comprises sampling the write operation to select a percentage of the write operations to be compressed using compression algorithm A prior to comparing the size of the respective write operation to the dynamically adjustable write IO size threshold value.

6. The method of claim 1, wherein in response to a determination that the size of the respective write operation is larger than the dynamically adjustable write IO size threshold value, the method further comprises sampling the write operation to select a percentage of the write operations to be compressed using compression algorithm A instead of compressing data of the respective write operation using compression algorithm B.

7. The method of claim 1, further comprising:
receiving a target data reduction ratio;
determining a currently achieved data reduction ratio; and
comparing the currently achieved data reduction ratio with the target data reduction ratio;
in response to a determination that the currently achieved data reduction ratio does not match the target data reduction ratio:
adjusting the dynamically adjustable extent compressibility ratio threshold value; or
adjusting the dynamically adjustable write IO size threshold value; or
adjusting both the dynamically adjustable extent compressibility ratio threshold value and the dynamically adjustable write IO size threshold value.

8. The method of claim 1, further comprising:
receiving a target data reduction ratio;
determining a currently achieved data reduction ratio; and
comparing the currently achieved data reduction ratio with the target data reduction ratio;
in response to a determination that the currently achieved data reduction ratio is higher than the target data reduction ratio:
changing the dynamically adjustable extent compressibility ratio threshold value to select a smaller percentage of write operations for compression using compression algorithm B; or
changing the dynamically adjustable write IO size threshold value to select a smaller percentage of write operations for compression using compression algorithm B; or
changing both the dynamically adjustable extent compressibility ratio threshold value and the dynamically adjustable write IO size threshold value to select a smaller percentage of write operations for compression using compression algorithm B.

9. The method of claim 1, further comprising:
receiving a target data reduction ratio;
determining a currently achieved data reduction ratio; and
comparing the currently achieved data reduction ratio with the target data reduction ratio;
in response to a determination that the currently achieved data reduction ratio is lower than the target data reduction ratio:
changing the dynamically adjustable extent compressibility ratio threshold value to select a larger percentage of write operations for compression using compression algorithm B; or
changing the dynamically adjustable write IO size threshold value to select a larger percentage of write operations for compression using compression algorithm B; or
changing both the dynamically adjustable extent compressibility ratio threshold value and the dynamically adjustable write IO size threshold value to select a larger percentage of write operations for compression using compression algorithm B.

10. A compression engine, comprising:
first compression hardware configured to implement data compression operations using compression algorithm A;
second compression hardware configured to implement data compression operations using compression algorithm B; and one or more processors and one or more storage devices storing instructions that are operable, when executed by the one or more processors, to cause the one or more processors to perform operations comprising:

computing a per-extent compressibility ratio for each extent of data stored on a storage system, the per-extent compressibility ratio comparing a first compressibility of segments of data of the respective extent when compressed using compression algorithm A and a second compressibility of segments of data of the respective extent when compressed using compression algorithm B;

receiving write operations, each write operation being directed to a respective portion of a segment of a respective extent;

for each write operation:
  determining a respective compressibility ratio for the respective extent;
  comparing the compressibility ratio for the respective extent with a dynamically adjustable extent compressibility ratio threshold value;
  in response to a determination that the compressibility ratio for the respective extent indicates that the extent exhibits greater compressibility using compression algorithm B than using compression algorithm A, comparing a size of the respective write operation to a dynamically adjustable write IO size threshold value;
  in response to a determination that the size of the respective write operation is larger than the dynamically adjustable write IO size threshold value, compressing data of the respective write operation using the second compression hardware configured to implement data compression operations using the compression algorithm B; and
  in response to a determination that the compressibility ratio for the respective extent indicates that the extent does not exhibit greater compressibility using compression algorithm B than using compression algorithm A, or in response to a determination that the size of the respective write operation is smaller than the dynamically adjustable write IO size threshold value, compressing data of the respective write operation using the first compression hardware configured to implement data compression operations using the compression algorithm A.

11. The compression engine of claim 1 wherein compression algorithm A is faster and less computationally intensive than compression algorithm B, and wherein compression algorithm A on average results in a lower data reduction ratio than compression algorithm B.

12. The compression engine of claim 10, wherein compression algorithm A is more computationally efficient at compressing smaller sized write operations than compression algorithm B, and wherein compression algorithm B is more computationally efficient at compressing larger sized write operations than compression algorithm A.

13. The compression engine of claim 10, wherein computing a per-extent compressibility ratio for each extent of data comprises maintaining a per-extent compressibility histogram for each extent, the per-extent compressibility histogram containing a plurality of compression size buckets for each compression algorithm, and populating the buckets of the per-extent compressibility histogram in connection with compressing data of write operations on segments of data of the respective extent.

14. The compression engine of claim 10, wherein in response to a determination that the compressibility ratio for the respective extent indicates that the extent exhibits greater compressibility using compression algorithm B than using compression algorithm A, the operations performed by the one or more processors further comprise sampling the write operation to select a percentage of the write operations to be compressed using the first compression hardware configured to implement compression algorithm A prior to comparing the size of the respective write operation to the dynamically adjustable write IO size threshold value.

15. The compression engine of claim 10, wherein in response to a determination that the size of the respective write operation is larger than the dynamically adjustable write IO size threshold value, the operations performed by the one or more processors further comprise sampling the write operation to select a percentage of the write operations to be compressed using the first compression hardware configured to implement compression algorithm A instead of compressing data of the respective write operation using the second compression hardware configured to implement compression algorithm B.

16. The compression engine of claim 10, wherein the operations performed by the one or more processors further comprise:
  receiving a target data reduction ratio;
  determining a currently achieved data reduction ratio; and
  comparing the currently achieved data reduction ratio with the target data reduction ratio;
  in response to a determination that the currently achieved data reduction ratio does not match the target data reduction ratio:
    adjusting the dynamically adjustable extent compressibility ratio threshold value; or
    adjusting the dynamically adjustable write IO size threshold value; or
    adjusting both the dynamically adjustable extent compressibility ratio threshold value and the dynamically adjustable write IO size threshold value.

17. The compression engine of claim 10, wherein the operations performed by the one or more processors further comprise:
  receiving a target data reduction ratio;
  determining a currently achieved data reduction ratio; and
  comparing the currently achieved data reduction ratio with the target data reduction ratio;
  in response to a determination that the currently achieved data reduction ratio is higher than the target data reduction ratio:
    changing the dynamically adjustable extent compressibility ratio threshold value to select a smaller percentage of write operations for compression using compression algorithm B; or
    changing the dynamically adjustable write IO size threshold value to select a smaller percentage of write operations for compression using compression algorithm B; or
    changing both the dynamically adjustable extent compressibility ratio threshold value and the dynamically adjustable write IO size threshold value to select a smaller percentage of write operations for compression using compression algorithm B.

18. The compression engine of claim 10, wherein the operations performed by the one or more processors further comprise:
  receiving a target data reduction ratio;
  determining a currently achieved data reduction ratio; and comparing the currently achieved data reduction ratio with the target data reduction ratio;
in response to a determination that the currently achieved data reduction ratio is lower than the target data reduction ratio:
  changing the dynamically adjustable extent compressibility ratio threshold value to select a larger percentage of write operations for compression using compression algorithm B; or
  changing the dynamically adjustable write IO size threshold value to select a larger percentage of write operations for compression using compression algorithm B; or
  changing both the dynamically adjustable extent compressibility ratio threshold value and the dynamically adjustable write IO size threshold value to select a larger percentage of write operations for compression using compression algorithm B.

* * * * *